METHOD FOR ADJUSTING CAPACITANCE VALUES
Filed March 26, 1968
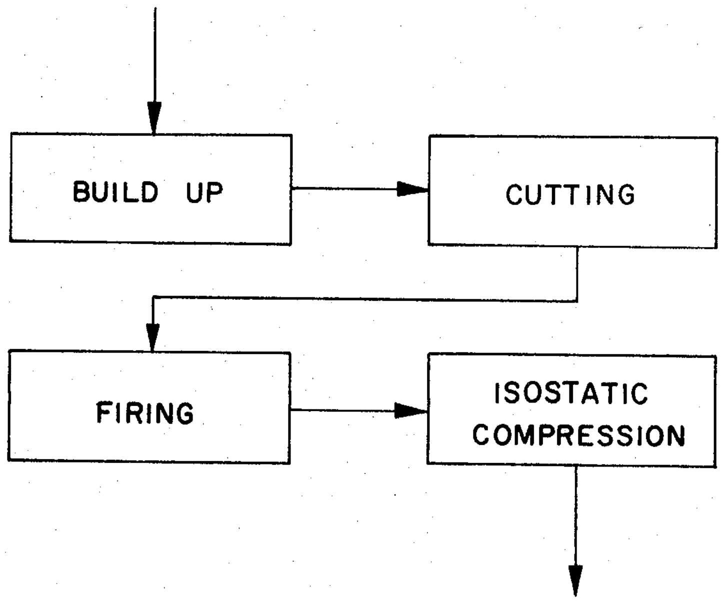
INVENTOR
ROBERT SWART
BY
ATTORNEY United States Patent Office 3,623,199

Patented Nov. 30, 1971

3,623,199

METHOD FOR ADJUSTING CAPACITANCE VALUES

Robert Swart, Newtown, Conn., assignor to Vitramon Incorporated, Monroe, Conn.

Filed Mar. 26, 1968, Ser. No. 716,244
Int. Cl. H01g *13/00*
U.S. Cl. 29—25.42 4 Claims

ABSTRACT OF THE DISCLOSURE

A method of adjusting the capacitance value of a fired monolithic electronic component which comprises subjecting the fired component to an increased pressure and a temperature in the softening range of the dielectric to reduce the volume of the void population in the dielectric.

One of the most acute problems in the fabrication of solid-state monolithic capacitors, especially those with a porcelain or ceramic dielectric, is the relatively wide variance in the capacitance rating of the individual components resulting from a given build-up lot. Production experience has shown that, on the average, only 21% of the capacitors derived from a given lot will be within plus or minus 1% of the designed for capacitance nominal value. Thus, if tolerance is critical, as it most often is, upwards of 79% of each build-up lot is theoretically rejectable. The direct manifestations of this characteristic process inaccuracy are two-fold. First, each individual component must be tested to determine its capacitance value, a time consuming, tedious and inordinately expensive procedure. Second, components having capacitance values above the desired range have to be reworked, usually by drilling into one or more of the component plates or otherwise reducing its overall dimensions to thereby reduce the effective plate area, until the desired value is achieved. This again requires individual handling and testing, rehandling and retesting of each capacitor in this group. Those components having values below the desired nominal must either be marketed in that range, if possible, or scrapped. When these factors of individual testing, reworking of components on the high side of the desired capacitance rating, and scrapping or selling at a reduced price those components on the low side of the desired range, are totaled, their combined effect significantly distorts the final price of a component within the desired plus or minus 1% of design range.

Investigation into the causes for this range of capacitance values from a single build-up lot has found that while the true K value of the dielectric material cannot change, it being a constant, its relative value for each component is directly affected by the void population in the component. That is, when the components are fired, gases, generated from the combustion of the organic binders used to formulate the suspension of the dielectric material, are trapped within the component, forming voids in the dielectric. The more voids per unit volume of dielectric, realizing that it is not uncommon to find entire lots of porcelain parts with a void volume of 30%, the lower the capacitance rating of the component, and vice versa.

The problem, then primarily, was how to minimize these voids; or, alternatively, how to minimize the effect that the voids have on the finished component. Heretofore, the main thrust of the prior art has been directed toward attempting to eliminate the voids during the fabricating process, either by varying the solvent and vehicle concentrations and compositions; or, by adjusting the absorption technique used to remove most of the solvent after the deposition of each dielectric layer. While some of these improved techniques did meet with partial success they did not measurably affect the 21%–79% ratio of components falling within the all important 1% of design capacitance range.

Applicant has addressed himself to this problem and as shown hereinafter, he has devised a procedure whereby the capacitance value of an entire lot of components may be adjusted after the fabrication process is complete. The basis of this process is isostatic compression, i.e., subjecting a lot of finished components to an elevated pressure and a temperature within the softening range of the dielectric material. In this manner, the volume assumed by the closed porosity is significantly reduced relative to the area of dielectric material and the relative K value of the dielectric material is increased. Thus, the capacitance average of the lot can be centered about a desired nominal value.

It is therefore an object of the present invention to materially affect the capacitance value of a finished capacitor.

It is therefore another object of the present invention to significantly reduce the volume of the void population of a monolithic solid state electronic component.

It is a still further object of the present invention to center the capacitance ratings of a lot of electronic components around a desired nominal rating.

It is yet another object of the present invention to subject a lot of electronic components to isostatic compression to alter the electrical parameters of the components.

The subject matter which applicant regards as his invention is particularly pointed out and distinctly claimed in the concluding portion of this specification. The invention, however, as to its organization and method of operation together with further objects and advantages thereof will best be understood by reference to the following description taken in conjunction with the accompanying drawing which is a diagrammatic flow sheet of an exemplary type of fabrication process utilizing the present invention.

The present invention will now be described in detail for a particular porcelain dielectric composition capacitor. It should be understood, however, that the described environment is by way of example only; the procedure of the present invention being equally as applicable on any type of electronic component using any type of material subject to voids and wherein adjustment in the void population directly or indirectly affects the electrical characteristics of the component.

The process is initiated by the preparation of a fluid and plastic suspension of a powdered dielectric material, which may for example, be composed of:

| | Percent by weight |
|---|---|
| PbO | 53.2 |
| $SiO_2$ | 27.1 |
| $K_2O$ | 2.6 |
| $Na_2O$ | 1.6 |
| $LiO_2$ | 0.7 |
| NaF | 4.5 |
| MgO | 3.6 |
| SrO | 6.7 |

These ingredients are thoroughly mixed and then heated until they are in a fluid state. The fluid is poured into a water bath to cool and form a coarse frit; the frit being subsequently ground into a fine powder and mixed with an organic vehicle and 80% to 70% of inorganic ingredients. These mixes result in a fluid and plastic suspension which can be easily spread into layers of the desired thickness.

At the same time a suspension of a conductive metal, in this example, silver, is prepared for the conductive plates of the component. A typical mixture employs 70% to 50% silver by weight in 30% to 50% by weight of organic vehicle. The vehicle may comprise:

| | Percent by weight |
|---|---|
| Cellosolve | 85 |
| Ethyl cellulose | 5 |
| Hydrogenated rosin | 10 |

The technique of depositing the alternating layers or sheets of dielectric material and conductive material is called the "build-up" process, and is continued until the number of conductive layers necessary for the designed capacitance rating is achieved. This process is fully described in United States Letters Pat. No. 2,779,975, issued on Feb. 5, 1957 to Pyungtoo W. Lee and Barton L. Weller. It should be sufficient at this point to say that the layers are formed one on top of the other, with each layer being slightly hardened before the addition of subsequent layers. The desired partial hardening is accomplished by removing a portion of the suspending medium. It is essential, however, that part of the suspending medium be retained to maintain the continuity of the suspension and to prevent the deposited layer from becoming discontinuous during the build-up process. Each layer is thus replete with liquid filled interstices and, in the ideal situation has the consistency of partially set putty. The composite or laminate, which at this point can still be considered to be comprised of individual layers, is then cut into the desired number of components and the components fired to fuse or sinter the individual layers and form them into a monolithic body.

It is at this point in the process that the problem of variation in capacitance ratings of individual components from a given build-up lot arises. The pieces for this particular exemplary combination of materials, are fired at about 700° C. to combust the organic vehicles, vitrify the porcelain, and coalesce the silver. However, a portion of the gases, resulting from the combustion of the organics, remain trapped in the interior of the component, filling it with voids. These voids, often amounting to as much as 30% of the total dielectric material volume, in turn, have a pronounced effect on the relative K value of the dielectric and thus on the capacitance value of the component. It has been demonstrated that the K value of a mixture of dielectric materials is a value somewhere between the values of the ingredients of the mixture. It has been further demonstrated that the K value of the mixture will shift in a non-linear relationship toward one or the other of the ingredients relative to the effective volume of the ingredient in the mixture. Thus, since the relationship is not linear, a significant void population can disproportionately shift the K value away from that of the porcelain and toward that of the retained gases.

Applicant has found that he can substantially reduce the void population of a component and thus return its capacitance rating to the designed for range by an isostatic compression procedure following the firing of the components. Basically, the process involves reheating of the fired components to a temperature within the softening range of the dielectric material and at a pressure sufficient to compress the dielectric to the point where the volume assumed by the gas filled voids is materially reduced. At room temperature the fired components are inelastic and, thus, noncompressible. However, when the temperature is raised into the softening range of the dielectric material the component is readily amenable to the pressure induced compression. It should be understood at this juncture that the retained gases do not escape the component, but are compressed into a much smaller volume than they previously occupied. Pressure equally applied from all sides of the component, in the manner of the present invention, gradually reduces the size of the gas pockets without doing any physical or electrical damage to the component. As explained above, the shift in relative volume between the dielectric material and the trapped gases, with the dielectric material now assuming an overwhelming predominance of the total volume allows the permittivity of the dielectric material to approach its theoretical value and the capacitance rating of the component to come within the all important plus or minus 1% of design range. As a still further advantage, applicant has found that isostatic compression of the component following firing greatly enhances the dielectric strength of the component. In this regard, the voids can be considered defects which promote arcing between conductive plates and thus failure of the component. Reduction in the size, frequency and spatial relationship between the voids, thus, increases the voltage which the component can withstand before it fails.

From a practical standpoint, it will be realized that the exact combinations of temperature and pressure used during the isostatic compression procedure will, of course, depend upon the type of dielectric material used in the component. In the particular component described by way of example herein the preferred temperature range is from 600°–700° C. and the pressure is preferably kept below 180 p.s.i.

As this invention may be embodied in several forms without departing from the spirit or essential characteristics thereof, the present embodiment is illustrative and not restrictive. The scope of the invention is defined by the appended claims rather than by the description preceding them, and all embodiments which fall within the meaning and range of equivalency of the claims are, therefore, intended to be embraced by those claims.

I claim:

1. A process for making electronic components comprising the steps of:
   (a) depositing alternating layers of a dielectric material selected from the group consisting of porcelain and ceramics, and a conductive material one on top of the other until a laminated build-up of the desired thickness and electrical properties is obtained;
   (b) firing the laminated build-up at the sintering temperature of the dielectric material to fuse the individual layers into a monolithic body; and,
   (c) subjecting uniformly all sides of the monolithic body to isostatic compression at a temperature in the softening range of the dielectric and at a pressure above atmospheric pressure but below 180 p.s.i. to substantially compress the void population in the dielectric material of the component.

2. A process for making electronic components as defined in claim 1 wherein the fired monolithic body is cooled to room temperature before it is subjected to isostatic compression.

3. A process for making electronic components as defined in claim 2 wherein the alternating layers of dielectric material and conductive material are deposited as sheets and the laminated build-up is cut into individual components before it is fired into a monolithic body.

4. A method of adjusting the capacitance value of a previously fired monolithic electronic component comprising the steps of:
   (a) introducing the component to a first zone;
   (b) raising the temperature in the first zone into the softening range of the dielectric material used in the component;
   (c) concurrently increasing the pressure on all sides of the monolithic component in the first zone to a level above atmospheric but below 180 p.s.i. sufficient to compress the voids in the dielectric material; and (d) maintaining the temperature and pressure until the desired capacitance value is achieved.

References Cited

UNITED STATES PATENTS

| | | | |
|---|---|---|---|
| 1,505,600 | 8/1924 | Pickard | 29—25.42 |
| 1,627,493 | 5/1927 | Dubilier | 29—25.42 |
| 2,526,704 | 10/1950 | Bair | 29—25.42 |
| 3,274,663 | 9/1966 | Bonenfant et al. | 29—25.42 |
| 3,235,939 | 2/1966 | Rodriguez et al. | 27—25.42 |
| 2,531,389 | 11/1950 | Brandt | 29—25.42 |

JOHN F. CAMPBELL, Primary Examiner

R. B. LAZARUS, Assistant Examiner